United States Patent [19]

Prentice

[11] 4,385,828

[45] May 31, 1983

[54] METHOD FOR TRANSFERRING AN IMAGE FROM A TRANSLUCENT MATERIAL TO A PHOTOSENSITIZED MATERIAL

[76] Inventor: Leland T. Prentice, 204 Ponderosa La., Space #7, Burleson, Tex. 76028

[21] Appl. No.: 238,571

[22] Filed: Feb. 26, 1981

[51] Int. Cl.³ ............................................. G03B 27/02
[52] U.S. Cl. .................................. 355/132; 355/32; 355/88
[58] Field of Search ...................... 355/32, 35, 77, 88, 355/132; 430/394, 396, 494

[56] References Cited

U.S. PATENT DOCUMENTS

| | | | |
|---|---|---|---|
| 3,801,198 | 4/1974 | David | 355/32 |
| 3,873,202 | 3/1975 | Inoue | 355/88 |
| 3,914,721 | 10/1975 | Pollock | 355/88 X |

Primary Examiner—Richard A. Wintercorn
Attorney, Agent, or Firm—Cahill, Sutton & Thomas

[57] ABSTRACT

The method disclosed enables one to transfer an image from a translucent material to a photosensitized material. Initially a translucent material which includes an image is placed between an unexposed sensitized material, such as a film negative, and a source of light. The source of light is energized for a predetermined time interval to pass light through the translucent material onto the negative to transfer the image from the translucent material to the film negative. The film negative can then be used to expose a printing press plate, such as a lithographic plate. The method can be used to transfer either black and white or color line work, pre-screened image material and either black and white or color image material to one or more film negatives or sheets of sensitized material.

14 Claims, 6 Drawing Figures

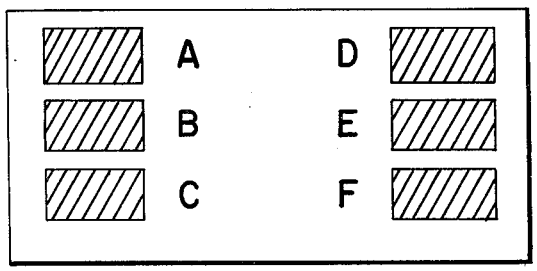
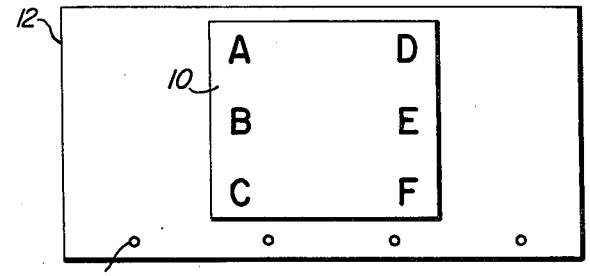
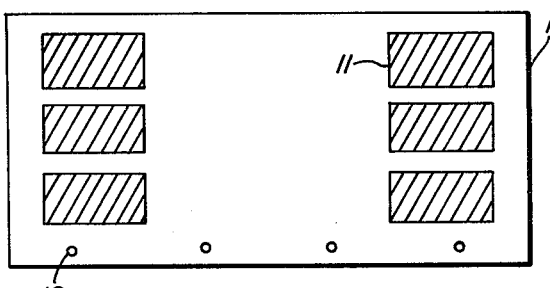
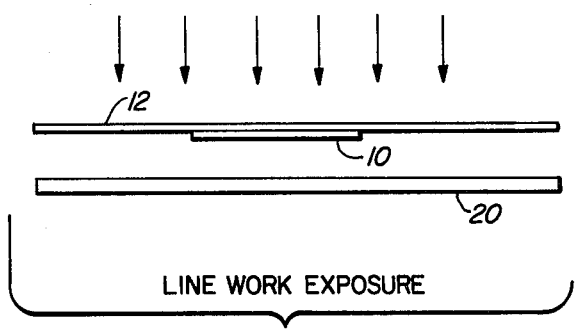
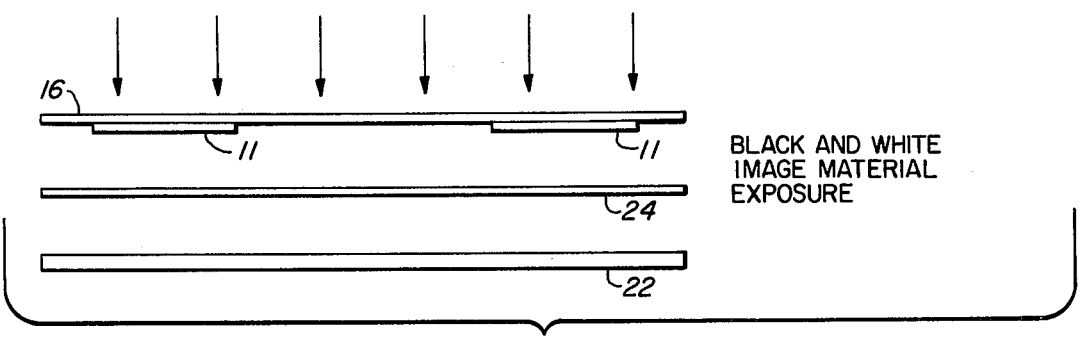
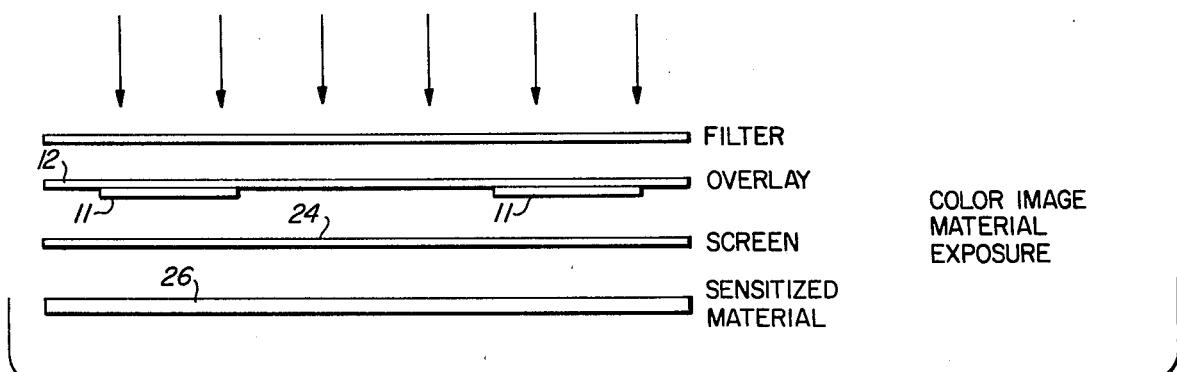

METHOD FOR TRANSFERRING AN IMAGE FROM A TRANSLUCENT MATERIAL TO A PHOTOSENSITIZED MATERIAL

BACKGROUND OF THE INVENTION

1. Field of the Invention

The present invention relates to printing or reproduction methods and, more particularly, to a method for transferring an image from a translucent material to a photosensitized material or printing press plate.

2. Description of the Prior Art

Utilizing conventional techniques to transfer either line work or color or black and white image material from photographic prints, type written or type set materials or other image or line work sources to photosensitized materials suitable for exposing printing press plates requires a significant number of man-hours to accomplish the required camera work and stripping procedures. These characteristics of existing printing procedures render it slow, time consuming and comparatively expensive.

In addition, it is not uncommon to observe misaligned and improperly registered color reproductions which are created by a failure to maintain all color separation negatives in proper alignment on a continuous basis during the printing process. In order to accomplish high quality color printing work, careful and tedious visual alignment procedures are required and frequent quality control inspections must be implemented to maintain a uniformly high quality for color reproduction work.

SUMMARY OF THE INVENTION

It is therefore a principal object of the present invention to provide a method for directly transferring an image from a translucent material to a photosensitized material suitable for exposing a printing press plate which incorporates an easily implemented system for continuously maintaining the required alignment between the translucent material, the sensitized material and the printing press plate.

Another object of the present invention is the provision of a method for directly transferring an image from a translucent material to a photosensitized material which eliminates the requirement for camera and stripping work as an image is transferred from the photosensitized material to a printing press plate.

Yet another object of the present invention is the provision of a method which can produce a photographic image suitable for exposing a printing press plate from any translucent source material.

Still another object of the present invention is the provision of a method for directly transferring an image from a translucent material to a photosensitized material suitable for exposing a printing press plate which utilizes a pin registration system to eliminate the visual alignment procedures.

Briefly stated, and in accord with one embodiment of the invention, a method is disclosed for directly transferring an image from a translucent material to a photosensitized material which may be utilized to expose a printing press plate. The method includes the steps of placing a translucent material including an image between an unexposed photosensitized material and a source of light and then energizing the source of light for a predetermined time interval to pass light through the translucent material onto the sensitized material to transfer the image from the translucent material to the sensitized material.

DESCRIPTION OF THE DRAWINGS

The invention is pointed out with particularity in the appended claims. However, other objects and advantages together with the operation of the invention may be better understood by reference to the following detailed description taken in conjunction with the following illustrations wherein:

FIG. 1 represents a highly simplified representation of a desired printed end product including both image material which is represented by the six shaded rectangular blocks and line work which is represented by the letters "A"–"F".

FIG. 2 indicates the contents of a first overlay which includes the line work required to produce the desired composite product illustrated in FIG. 1.

FIG. 3 illustrates the content of a second overlay including the image material which is required to produce the composite product illustrated in FIG. 1.

FIG. 4 illustrates the relative positioning of the first overlay and an unexposed photosensitized material which permits the transfer of the line work to the line work sensitized material from the first overlay illustrated in FIG. 2.

FIG. 5 illustrates the relative positioning of the second overlay, a half tone screen and an unexposed sheet of photosensitized material which permits the transfer of the black and white image material from the second overlay to a second sheet of photosensitized material.

FIG. 6 illustrates the relative positioning of a color separation filter, an overlay including color image material, a half tone screen and an unexposed sheet of photosensitized material which is used when the method of the present invention is implemented to produce color separation negatives or positives.

DESCRIPTION OF THE PREFERRED EMBODIMENT

In order to better illustrate the advantages of the invention and its contributions to the art, the various procedures relating to the preferred embodiment of the invention will be disclosed in connection with FIGS. 1 through 6. Initially, the inventive method will be discussed in connection with the reproduction of black line work and then black image material. Subsequently, the inventive method will be discussed in connection with the production of color separation negatives or positives suitable for exposing printing press plates for reproducing color source material and either color or black and white line material.

Referring now to FIGS. 1 through 5, the inventive method will be discussed in connection with the reproduction of a printed end product which includes both black and white line work and black and white image material. In FIG. 1 and in FIG. 3, the shaded rectangular squares represent black and white image material which is formed on the surface of a translucent material such as a black and white photographic print or enlargement. In FIG. 1 and FIG. 2, the letters "A"–"F" represent black and white line work which is desired to be reproduced on the final printed product.

The first overlay illustrated in FIG. 2 and designated by reference number 12 includes the black and white line work desired on the resulting printed product. The line work consisting of the letters "A"–"F" is first imprinted on a translucent material such as a sheet of white paper indicated by reference number 10. The line work may be imprinted on sheet 10 by any conventional printing procedure, typing, hand lettering or any other equivalent method well known to one of ordinary skill in the art. The rear surface of paper sheet 10 is then secured in the desired position to a transparent overlay 12. A spray-on adhesive such as 3M77 Spray Adhesive (available from Minnesota Mining and Manufacturing) can be used to secure paper sheet 10 to overlay 12. A plurality of registration apertures indicated generally by reference number 14 are punched in the lower surface of overlay 12 by a conventional registration punch.

The second overlay designated by reference number 16 is also fabricated from a transparent material such as a Dupont Mylar. Registration apertures indicated by reference number 18 are punched along the lower boundary of overlay 16. The six black and white photographic prints which include the black and white image material are trimmed to the exact size or shape desired and are then secured image side up to overlay 16 as is illustrated in FIG. 3. A pin registered, transparent or translucent layout template may be utilized to assist in aligning line work sheet 10 with respect to overlay 12 and the image material with respect to overlay 16.

Referring now to FIGS. 4 and 5, overlay 12 is inverted so that the black and white line work on paper sheet 10 will be facing the emulsion side of an unexposed sheet of photosensitized material such as a film negative indicated by reference number 20. The lower border of film negative 20 must also include registration apertures to maintain desired alignment between the various overlays, film negatives or positives and printing press plates (such as a lithographic plate) which will be utilized during the practice of the present method.

Film negative 20 is typically exposed within one of many different types or types and sizes of commercially available contact printers. In the particular embodiment illustrated in FIG. 4, the contact printer will include a light source which is positioned above overlay 12 and paper sheet 10. The vertically oriented arrows indicate the optical output from the light source. The contact printer used must also include registration pins which are utilized to secure overlay 12 and film negative 20 in a fixed position with respect to the contact printer and with respect to each other.

The contact printer will also typically include a vacuum frame in which overlay 12 and film negative 20 will be positioned. During the exposure procedure, the vacuum frame of the contact printer is actuated to tightly sandwich together overlay 12 and film negative 20. The contact printer light source is then energized for a predetermined time to properly expose film negative 20. Initially the exposure time must be determined experimentally, but subsequently the exposure time can be readily computed based on the initial trial and error procedure and the results obtained. The exposure time must be sufficiently long such that a sufficient amount of light passes through paper 10 to completely expose negative 20, except directly below the line work.

When the light source is energized, light passes through the transparent section of overlay 12 directly onto the emulsion of film negative 20. When this section of the emulsion of film negative 20 is developed, it will produce an opaque, black section. Light will also pass through the entire area of paper sheet 10 which does not include the black line work symbolically designated by the letters "A"–"F". The corresponding sections of film negative 20 will also produce opaque, black negative material after the negative is developed. The black and white line work indicated by the letters "A" through "F" are opaque and will completely prevent the transmission of light onto film negative 20. Thus when film negative 20 is developed the entire negative will be completely black and opaque except for the area immediately adjacent to line work letters "A" through "F". The outline of these letters will be completely transparent on the negative.

If it is necessary to use several paper sheets to properly locate the line work on overlay 12, the various sections of paper used should be of reasonably uniform density. If one section of paper is much thinner than the others it may be necessary to reproduce the line work on that paper onto paper of more uniform density.

Once the exposure of film negative 20 is completed, film negative 20 and overlay 12 are removed from the contact printer.

Referring now to FIG. 5, the image material attached to overlay 16 and designated in FIGS. 3 and 5 by reference number 11 is now positioned face down (emulsion to emulsion) as illustrated in the contact printer. A second sheet of photosensitized material, such as a film negative indicated by reference number 22, is positioned below overlay 16 and a half tone screen 24 of a conventional design is inserted between overlay 16 and film negative 22. Film negative 22 and half tone screen 24 also include registration apertures which are produced by the registration punch discussed earlier. These three sheets of material are placed within the vacuum frame of the contact printer and the contact printer light source is energized for a predetermined time. When black and white image material 11 takes the form of black and white photographic prints it is necessary to trim the white borders from these prints before securing them to overlay 16.

All photographic prints or other translucent source material screened in this manner are self-masked due to the intense exposure required to penetrate the translucent material. The requirement of prior art methods for manual masking is thus eliminated.

At this point the film negatives 20 and 22 are developed and are utilized to sequentially expose a single black and white printing press plate, such as a lithographic plate, which includes pin registration apertures. Line work negative 20 is initially placed in pin registration alignment with the printing press plate and a first exposure is made to transfer the line work image from negative 20 to the printing press plate. Next, negative 22 is placed in pin registration with the same printing press plate and a second exposure is made which transfers the black and white image material on negative 22 to the printing press plate. Once developed, the printing press plate can be used in a printing process to reproduce the desired composite product illustrated in FIG. 1 which includes both black and white line material and black and white image material. Half tone screen 24 is utilized to produce a dot pattern on negative 22. Since one may occasionally procure pre-screened black and white image material which includes the required dot pattern, this pre-screened image material may be placed directly on overlay 12 and utilized to expose negative 20. In a simplified procedure of this type, the single negative 20 will thus include both the black and white line work as well as the pre-screened black and white image material and the printing press plate need only be exposed a single time.

A review of the steps of the present invention makes it clear that this method permits one to directly transfer images from a translucent material such as a photographic print or line work included on paper to a film negative which is suitable for exposing a printing press plate. It is also evident that numerous typically required steps such as camera work and stripping have been eliminated through the practice of the present method, but where previously required by conventional printing press reproduction techniques.

Although a greater number of steps is required to reproduce a composite printed product which includes either black and white or colored line work and colored image material, the procedures are essentially similar to those discussed above.

At this point let us assume that the image material depicted in FIGS. 1 and 3 now represents color image material which appears on a translucent material such as a color photographic print or any other translucent material such as cloth or a plastic material. Let us also assume that the line work illustrated in FIG. 2 which has been imprinted upon paper sheet 10 represents black and white line work. The procedure for forming the required line work negative is identical to the procedure discussed above in connection with FIGS. 2 and 4. The production of the red, blue and yellow color separation negatives and the black printer negatives will be discussed at this point.

To produce the appropriate color separation negatives, red, blue and green color separation filters must be positioned above the vacuum frame in the contact printer between overlay 12 and the contact printer light source. Color separation filters having dimensions commensurate with the dimensions of the negatives to be used are generally fabricated from a tinted plastic material. Rectangular red, blue and green sheets of plexiglass plastic have been found to function exceptionally well as color separation filters for use with the present method.

A conventional half tone screen designated by reference number 24 is positioned between overlay 12 and the sheet of photosensitized material such as a color separation negative which is designated by reference number 26. As is conventional practice, a different half tone screen 24 will be used to produce the red, blue and yellow color separation negatives. Typically the red half tone screen will have an angular orientation of 75°, while the blue and yellow half tone screens will have angular orientations of 105° and 90°.

The red color separation negative is produced by inserting in the contact printer the appropriate half tone screen 24 which has the desired angular orientation, such as 75°. A green plastic color separation filter is positioned as illustrated in FIG. 6. The contact printer vacuum frame is then actuated to compress overlay 12, half tone screen 24 and film negative 26. The contact printer light source is energized to expose negative 26. Upon development, negative 26 becomes the red color separation negative.

To produce the blue color separation negative, a red color separation filter, an appropriate half tone screen 24 and another unexposed negative 26 are inserted in the positions illustrated in FIG. 6. When developed, this negative produces the blue color separation negative.

The yellow color separation negative is produced by substituting a blue color separation filter and a different half tone screen having an angular orientation such as 90°.

A fourth sheet of photosensitized material such as an unexposed negative 26 is now inserted and a fourth half tone screen 24 having a different angular orientation from any of the three previously used half tone screens is also inserted to produce a black printer negative. Half tone screen 24 will generally have an angular orientation of 45° for the black printer negative. The black printer negative is exposed three times for a period of time approximately equal but not confined to a time period twice that of the exposure time used for the individual color separation negatives previously made. Initially the red color separation filter is inserted and a first exposure of the black printer negative is made. If the red, blue and yellow color separation negatives were exposed for ten seconds each, the black printer negative will be exposed for twenty seconds with the red color separation filter in place. The red separation filter is then removed and the blue separation filter is inserted and a second twenty second exposure is implemented. Finally, the blue separation filter is removed and the green separation filter is inserted in the appropriate position and the contact printer light source is energized for the same period of time. At this point the black printer negative can be removed and developed.

An alternative, but somewhat lower quality black printer negative can be made by making a single extended exposure of the black printer negative without the presence of either the red, blue or green separation filters.

As was mentioned above, a fifth negative will include the black and white line work.

Four separate printing press plates such as lithographic plates will now be exposed to enable the composite black and white and color printed product illustrated in FIG. 1 to be properly printed. Each of the printing press plates used will also include pin registration apertures as will overlay 12 and each of the four half tone screens which were used to produce the various color separation negatives. None of the color separation filters require alignment apertures since there is no image or negative material on the filter which must be maintained in alignment with any other element used in connection with the present method.

The red color separation negative is placed in pin registration alignment with and exposed to the first printing press plate. The same procedure is followed with the blue color separation negative and a second printing press plate and the yellow color separation negative and a third printing press plate. The black printer negative is aligned with the fourth printing press plate and exposed for an appropriate period of time. The fifth negative which includes the black and white line work is then coupled in pin registration alignment to the same fourth printing press plate and exposed for an appropriate period of time. No area of the fourth printing press plate will be double exposed since the opaque black sections of the black printer negative and the line work negative completely cover or mask off the image material with respect to each other as is illustrated by FIG. 1.

Thus by following the procedural steps described above, one can produce four pin registered printing press plates which can then be coupled in pin registration to a printing press which will reproduce the composite black and white and color product illustrated in FIG. 1. All of the elements of the line work and image work will be in perfect alignment as a result of the continuity between the pin registration procedures utilized consistently throughout this method. Visual alignment procedures required by typical prior art techniques are thus eliminated and a uniform, pleasing quality full color product can be reproduced quickly, with little man-power and with significantly less cost than any known prior art methods.

If one desires that the line work be reproduced in a color, such as red rather than black, a separate red line work can be fabricated and inserted in the contact printer to produce a red line work negative. The red line work negative can then be used to expose the red printing press plate during a second exposure following the red color separation negative exposure.

To obtain line work of colors other than red, blue or yellow, one can expose a separate line work overlay onto a combination of two or more different colored printing press plates. For example, green line work can be produced by exposing the special line work overlay onto the yellow printing press plate and the blue printing press plate. Various different hues of line work can be produced by inserting mechanical screens which attenuate light intensity in the light path between the special line work negative and the appropriate color printing press plate.

One type of sensitized material described in FIG. 6, No. 26 can be used in this entire method by placing emulsion down and penetrating the back of the film negative to produce a lateral reverse image needed in some types of printing.

It will be apparent to those skilled in the art that the disclosed method may assume many different forms other than the preferred forms specifically set out and described above. For example, a contact printer having a light source located below the unexposed photosensitized material functions in an equivalent manner as long as the filter, overlay, screen and negative are arranged in the order disclosed above. Accordingly, it is intended by the appended claims to cover all such modifications of the invention which fall within the true spirit and scope of the invention.

I claim:

1. A method of forming a color separation negative by transferring an image from a translucent material to a film negative comprising the steps of:
    a. placing the translucent material including an image between the unexposed film negative and a light source;
    b. inserting a color separation filter between the light source and the film negative;
    c. inserting a half tone screen between the light source and the film negative;
    d. compressing the color separation filter, translucent material, half tone screen and film negative into closely abutting contact; and
    e. energizing the light source for a predetermined time interval to transmit light through the color separation filter, translucent material and half tone screen onto the film negative to transfer a color separated image from the translucent material to the film negative.

2. The method of claim 1 including the further step of transferring the color separated image from said color separation negative to a printing press plate by exposing said film negative onto a first printing press plate.

3. The method of claim 1 wherein a contact printer provides the source of light utilized to expose said first sensitized material.

4. The method of claim 3 wherein the rear surface of said translucent material is secured to a transparent plastic overlay.

5. The method of claim 4 wherein said contact printer includes registration pins and wherein registration apertures are punched in said overlay, said film negative and in said lithographic plate to permit said overlay and said film negative to be coupled in said contact printer in a fixed alignment and wherein said fixed alignment is maintained when said negative is utilized to expose said lithographic plate.

6. A method of forming a complete set of color separation negatives by directly transferring color separated images from a translucent material including a colored image to individual color separation film negatives comprising the steps of:
    a. placing a first translucent material including a color image between a first unexposed photosensitized material and a source of light;
    b. inserting a first color separation filter in the light path between the source of light and said first sensitized material;
    c. inserting a first half tone screen between said first translucent material and said first sensitized material;
    d. energizing the source of light for a predetermined time interval to pass light through said first color separation filter, said first translucent material and said first half tone screen onto said first sensitized material to transfer a first color separated image from said first translucent material to said first sensitized material;
    e. inserting a second color separation filter in the light path between the source of light and a second photosensitized material;
    f. inserting a second half tone screen between said first translucent material and said second sensitized material;
    g. energizing the souce of light for a predetermined time interval to pass light through said second color separation filter, said first translucent material and said second half tone screen onto said second sensitized material to transfer a second color separated image from said first translucent material to said second sensitized material;
    h. inserting a third color separation filter in the light path between a source of light and a third sensitized material;
    i. inserting a third half tone screen between said first translucent material and said third sensitized material; and
    j. energizing the souce of light for a predetermined time interval to pass light through said third color separation filter, said first translucent material and said third half tone screen onto said third sensitized material to transfer a third color separated image from said first translucent material to said third sensitized material.

7. The method of claim 6 including the further step of forming a black printer negative by inserting a fourth half tone screen and by sequentially inserting one at a time said first, second and third color separation filters and sequentially energizing the souce of light for three predetermined time intervals to separately pass light through said first, second and third color separation filters and said first translucent material onto a fourth color separation negative to transfer a black printer image from said first translucent material to said fourth sensitized material.

8. The method of claim 7 including the further step of forming color separated printing press plates by sequentially exposing said first, second and third color separation negatives and said black printer negative to first, second, third and fourth printing press plates.

9. The method of claim 8 wherein a contact printer provides the source of light utilized to expose said first, second and third color separation negatives and said black printer negative.

10. The method of claim 9 wherein the rear surface of said first translucent material is secured to a first transparent overlay.

11. The method of claim 10 wherein said contact printer includes registration pins and wherein registration apertures are punched in said first overlay, said first, second and third color separation negatives, said black printer negative and said first, second, third and fourth printing press plates to permit said first overlay and said first, second and third color separation negatives and said black printer negative to be coupled in said contact printer in fixed alignment and wherein said fixed alignment is maintained when said first, second and third color separation negatives and said black printer negative are utilized to expose said first, second, third and fourth printing press plates.

12. The method of claim 9 wherein said contact printer includes a vacuum frame to tightly sandwich together the materials placed within said contact printer.

13. The method of claim 6 wherein said first, second and third color separation filters are positioned between said light source and said first translucent material.

14. The method of claim 7 wherein the image side of said first translucent material faces the emulsion side of said first, second and third color separation negatives and said black printer negative.

* * * * *